United States Patent [19]

Yamamoto et al.

[11] Patent Number: 5,446,879
[45] Date of Patent: Aug. 29, 1995

[54] DISC CHANGING APPARATUS WITH ERROR LOGGING

[75] Inventors: Takeshi Yamamoto, Tokyo; Tamiya Tanaka, Kanagawa; Hirotaka Yamamoto, Kanagawa; Rikizo Tabe, Kanagawa, all of Japan

[73] Assignee: Sony Corporation, Tokyo, Japan

[21] Appl. No.: 359,002

[22] Filed: Dec. 16, 1994

Related U.S. Application Data

[63] Continuation of Ser. No. 916,378, Jul. 21, 1992, abandoned.

[30] Foreign Application Priority Data

Jul. 27, 1991 [JP] Japan .................. 3-210210

[51] Int. Cl.$^6$ .............................. G06F 11/00
[52] U.S. Cl. ........................ 395/180; 369/53
[58] Field of Search ............ 371/15.1, 16.5, 29.1; 369/53; 395/575

[56] References Cited

U.S. PATENT DOCUMENTS

| | | | |
|---|---|---|---|
| 4,209,846 | 6/1980 | Seppa | 364/900 |
| 4,561,078 | 12/1985 | Nakayama | 369/38 |
| 4,637,049 | 1/1987 | Kunugi . | |
| 4,879,705 | 11/1989 | Aoyagi et al. | 369/32 |
| 5,023,817 | 6/1991 | Au et al. | 371/16.4 |
| 5,027,154 | 6/1991 | Ujiie et al. | 355/205 |
| 5,047,977 | 9/1991 | Hill et al. . | |
| 5,111,458 | 5/1992 | Hara | 371/16.5 |
| 5,128,885 | 7/1992 | Janis et al. | 395/575 |
| 5,155,731 | 10/1992 | Yamaguchi | 371/16.5 |
| 5,200,958 | 4/1993 | Hamilton et al. | 371/16.5 |
| 5,235,568 | 8/1993 | Masaru | 369/2 |
| 5,237,677 | 8/1993 | Hirosawa et al. | 371/16.5 |
| 5,278,840 | 1/1994 | Cutler et al. | 371/16.5 |

FOREIGN PATENT DOCUMENTS

| | | | |
|---|---|---|---|
| 130827 | 9/1985 | European Pat. Off. | G60K 20/16 |
| 416171 | 12/1989 | European Pat. Off. | G01R 31/00 |
| 434921 | 10/1990 | European Pat. Off. | H04B 1/40 |

OTHER PUBLICATIONS

Patent Abstracts of Japan, vol. 12, No. 197 JP63003985 (Kawaguchi).
Patent Abstracts of Japan, vol. 13, No. 258, JP1063177 (KItani).
Patent Abstracts of Japan, vol. 13, No. 361, JP1119838 (Tsuboi).

Primary Examiner—Robert W. Beausoliel, Jr.
Assistant Examiner—Albert Décady
Attorney, Agent, or Firm—Jay H. Maioli

[57] ABSTRACT

An electronic system having a function to output history information of error. A microprocessor assembled in the electronic system stores, into a memory unit, every occurrence of error, error information indicating the contents of errors of various controlled units constituting a mechanical deck unit controlled by the microcomputer, and accepts or receives a command of an operation unit to read out error information indicating those error contents from the memory unit to display history information of error on a display unit.

3 Claims, 7 Drawing Sheets

DISC CHANGING APPARATUS WITH ERROR LOGGING

This is a continuation of application Ser. No. 07/916,378 filed Jul. 21, 1992, now abandoned.

BACKGROUND OF THE INVENTION

1. Field of the Invention

This invention relates to electronic equipment in which a microcomputer for system control is assembled.

2. Description of the Prior Art

Microcomputers for control have been cheaply provided. Thus, in various types of electronic equipment such as ordinary home audio equipment or video equipment, etc., a microcomputer for system control is assembled in such equipment so that any complicated control operation can be carried out, thus to realize multi-function capabilities or to improve easiness of handling.

Further, in electronic equipment in which a microcomputer for system control is assembled, in the case where any error occurs in various units controlled by the microcomputer, recovery control for automatically recovering from the state where that error has occurred to a normal operating state, and/or an automatic stop control for preventing a serious fault or trouble from being induced, etc. are carried out by the microcomputer for system control in accordance with a predetermined control program.

Meanwhile, in electronic equipment in which the recovery control and/or the automatic stop control, etc. are carried out in accordance with a predetermined control program by a microcomputer for system control as described above, in the case where any error occurs, the equipment merely recovers from an error occurrence state by the recovery control, or simply recovers from an error occurrence state by a reset operation of the microcomputer even in the state where the operation was stopped by the automatic stop control. For this reason, there are many instances where it is difficult to clarify whether an error has occurred in the equipment and the cause of occurrence thereof. Thus, such equipment disadvantageously fails to take a suitable measure for an error.

SUMMARY OF THE INVENTION

In view of actual circumstances of electronic equipment in which a microcomputer for system control is assembled as described above, object of this invention is to provide an electronic equipment having a function to output a history or past record information of error in order to clarify the content of an error which has occurred and the cause of occurrence thereof.

To achieve the above object, in accordance with this invention, there is provided electronic equipment in which a microcomputer for system control is assembled, comprising: a plurality of units controlled by the microcomputer; non-volatile memory means adapted so that when any error occurs in these controlled units, error information indicating the content of that error is written into the memory means in accordance with a control by the microcomputer, and historical information of the occurrence of error for every respective controlled unit is stored in the memory means; and output means for reading out the error information from the memory means to output it.

In more actual terms, an error code is written into the memory means as error information indicating that an error occurs at the time of various operation controls of the controlled units, and error codes previously written are sequentially written into the memory means for every occurrence of error with the memory addresses being incremented so that the latest n number of error codes are stored thereinto as the historical information.

Further, when an error occurs in the controlled units, after the recovery operation of the controlled unit where that error has occurred is carried out, in the case where the faulty controlled unit does not recover to a normal operating state, error information indicating the content of that error is written into the memory means in accordance with the control by the microcomputer.

The electronic equipment may further comprise operation means connected to the microcomputer, and adapted to deliver, to the microcomputer, operation command information for carrying out operation controls of the respective controlled units and read-out command information for reading out history information stored in said memory means from said memory means.

The above-mentioned output means may be comprised of display means connected to the microcomputer, and adapted to display historical information read out from the memory means by an operation of the operation means.

In the electronic equipment according to this invention thus constructed, every time any error occurs in various units controlled by the microcomputer, error information indicating the content of that error is written into the non-volatile memory means, thereby to store historical information of the occurrence of error in the various controlled units into the memory means, and to read out, when needed, error information from the memory by the error information output means.

DESCRIPTION OF THE PREFERRED EMBODIMENT

A preferred embodiment of electronic equipment according to this invention will now be described in detail with reference to the attached drawings.

Figure 1:
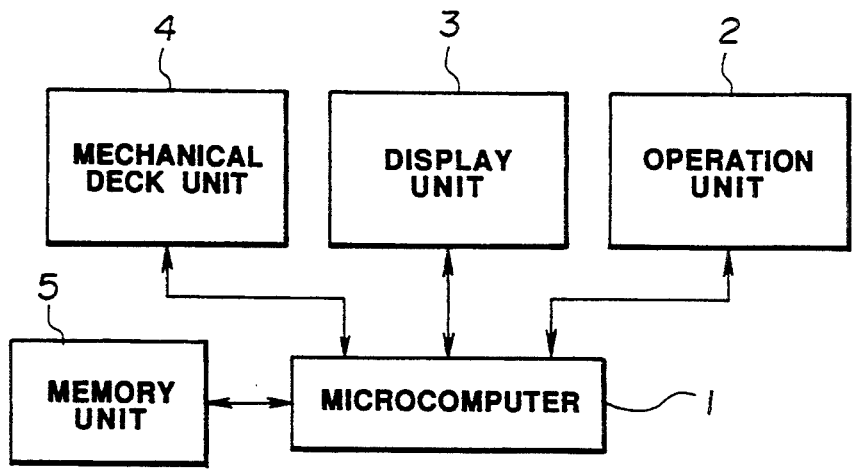
FIG. 1 is a block diagram showing the configuration of the essential part of a disk changer to which this invention is applied.

In the embodiment shown in block form in FIG. 1, this invention is applied to a disk changer adapted for automatically changing (exchanging) a recording medium in a CD player, i.e., a compact disk (CD) adapted to be mounted on a vehicle.

This disk changer includes a microcomputer 1 for system control, and an operation unit 2, a display unit 3, a mechanical deck unit 4, and a memory unit 5 which are connected to the microcomputer 1.

The operation unit 2 serves as operation command means for this disk changer, and delivers operation inputs supplied by operations of various operation buttons (not shown) to the microcomputer 1 as operation command information. Moreover, in accordance with a predetermined control program written in advance in the memory unit 5, the microcomputer 1 carries out a display control for displaying an operation procedure, etc. on the display unit 3, and carries out an operation control of the mechanical deck unit 4 in dependency upon operation command information from the operation unit 2. Further, the memory unit 5 includes a Read Only Memory (ROM) in which a predetermined control program is written, and a Random Access Memory (RAM) for temporarily storing control data, etc., and further includes a non-volatile memory such as E$^2$-PROM, etc. adapted so that every time an error occurs in any controlled units of the mechanical deck unit 4 of which operation is controlled by the microcomputer 1, error information indicating the content of that error is written by the microcomputer 1.

Figure 2:
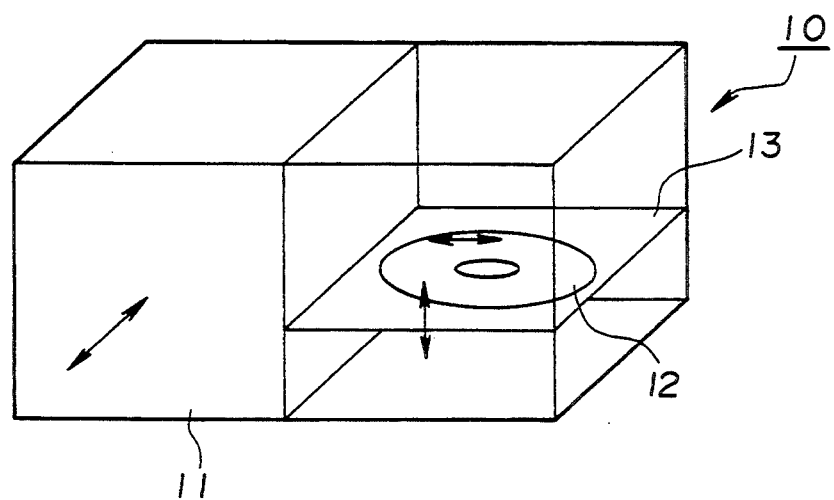
FIG. 2 is a perspective view showing the outline of the configuration of a mechanical deck unit of the above-mentioned disk changer.

Furthermore, the mechanical deck unit 4 comprises, as shown in FIG. 2, a unit body 10, a magazine 11 in which a plurality of compact disks are accommodated, a magazine feed mechanism (not shown) adapted for putting the magazine 11 in the unit body 10 and taking it out therefrom, a disk feed mechanism (not shown) adapted for a compact disk in the magazine 11 and taking it out therefrom, an elevator 13 adapted to mount thereon a compact disk 12 sent out from the magazine 11 and to move it upwardly and downwardly, an elevator mechanism (not shown) for moving the elevator 13 upwardly and downwardly.

Figure 3:
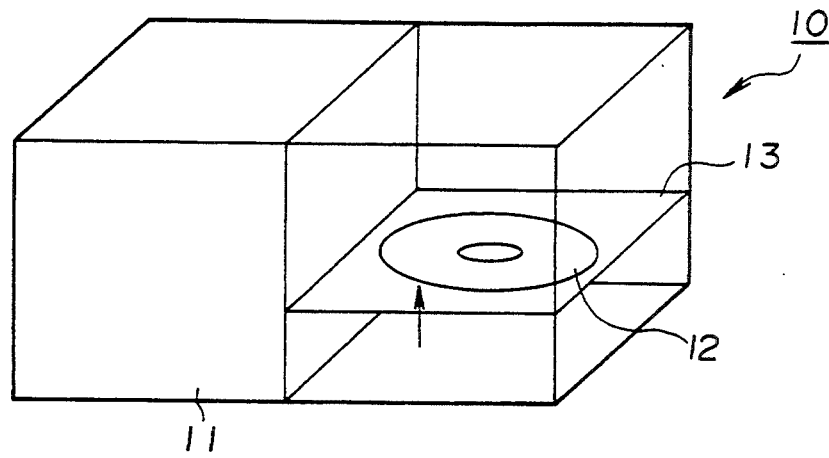
FIG. 3 is a perspective view showing, in a model form, the CBS operating state of the above-mentioned mechanical deck unit.
Figure 4:
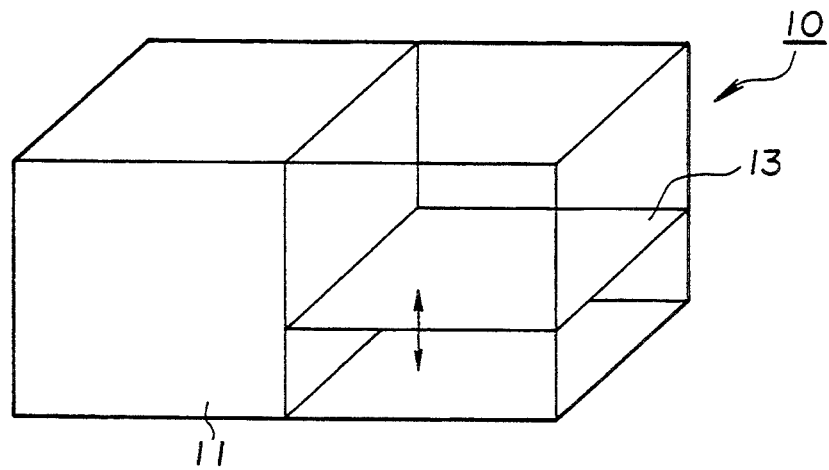
FIG. 4 is a perspective view showing, in a model form, the DGS operating state of the above-mentioned mechanical deck unit.
Figure 5:
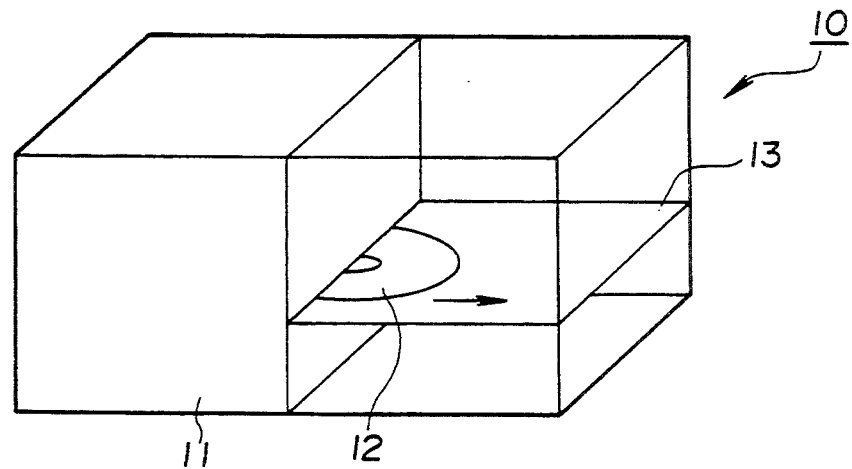
FIG. 5 is a perspective view showing, in a model form, the LOAD operating state of the above-mentioned mechanical deck unit.
Figure 6:
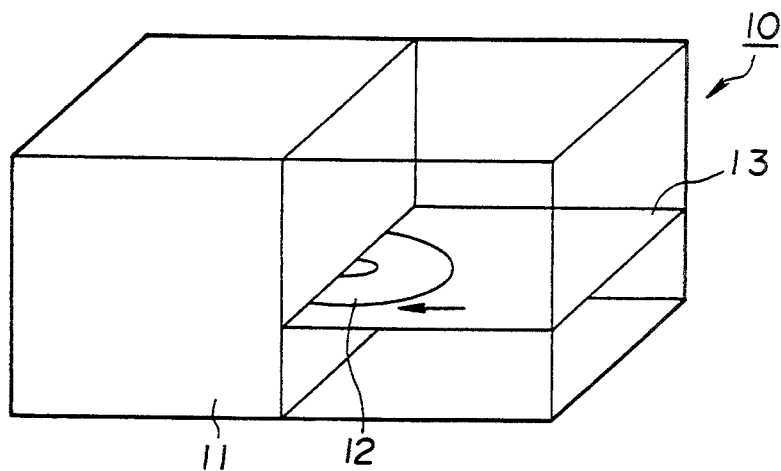
FIG. 6 is a perspective view showing, in a model form, the SAVE operating state of the above-mentioned mechanical deck unit.
Figure 7:
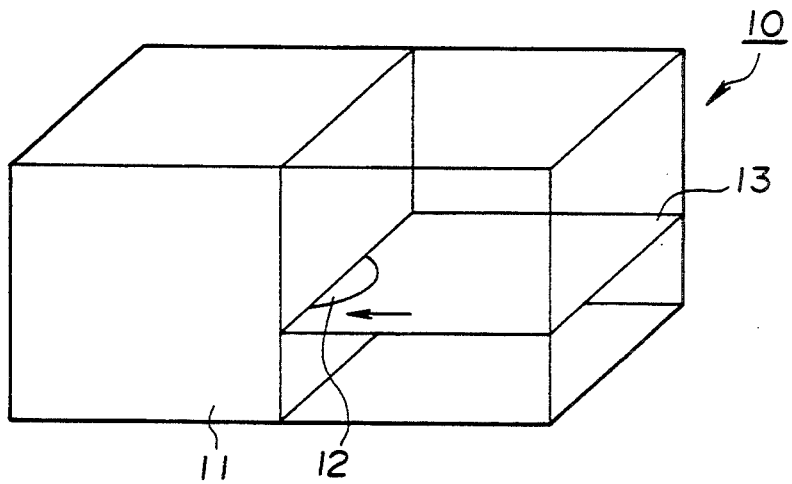
FIG. 7 is a perspective view showing, in a model form, the LVO operating state of the above-mentioned mechanical deck unit.
Figure 8:
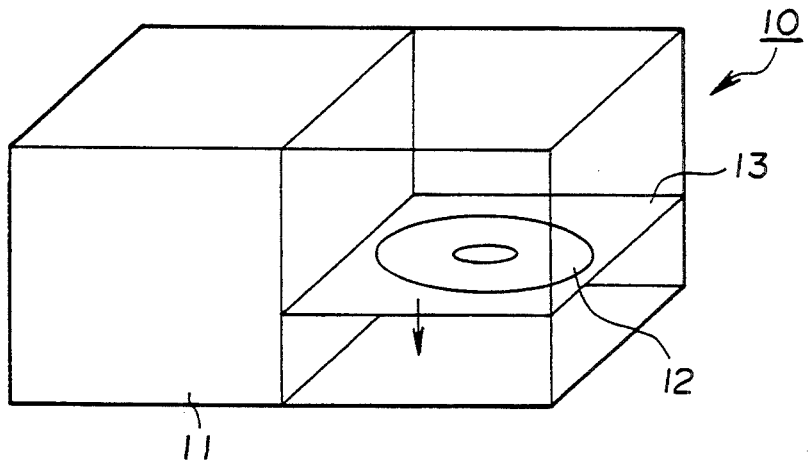
FIG. 8 is a perspective view showing, in a model form, the GTH operating state of the above-mentioned mechanical deck unit.
Figure 9:
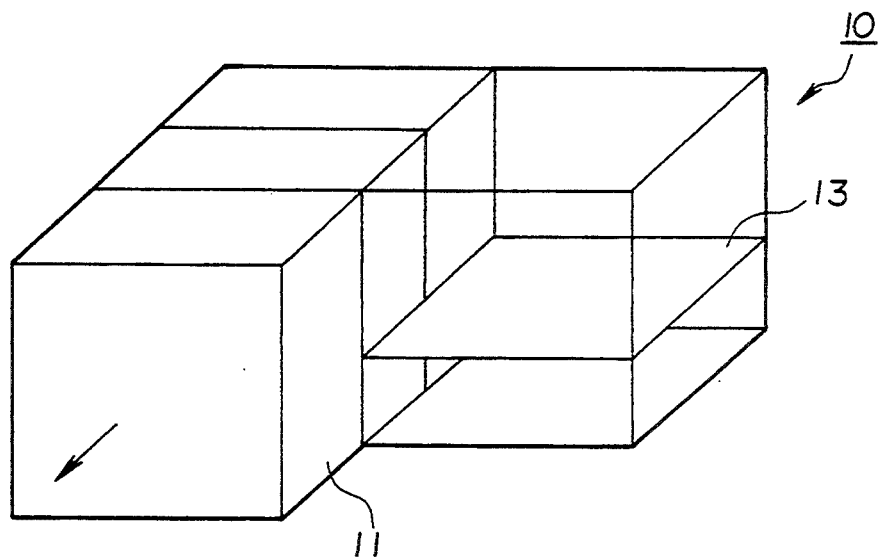
FIG. 9 is a perspective view showing, in a model form, the EJECT operating state of the above-mentioned mechanical deck unit.
Figure 10:
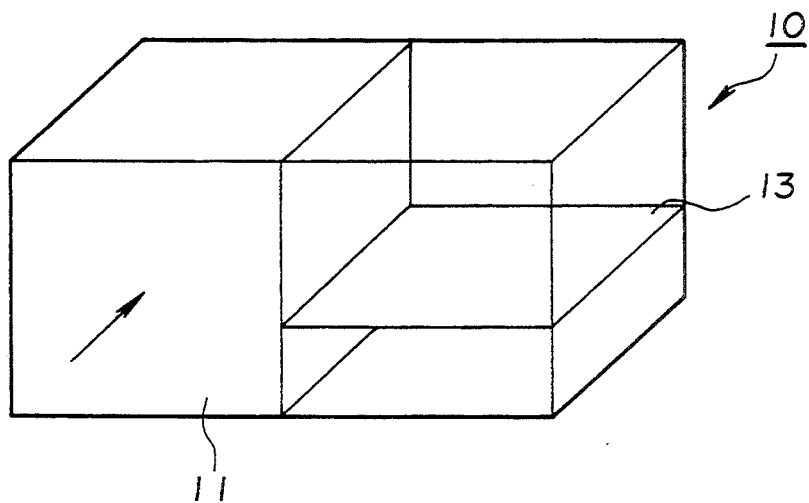
FIG. 10 is a perspective view showing, in a model form, the PSET operating state of the above-mentioned mechanical deck unit.

This mechanical deck unit 4 is controlled by the microcomputer 1, and serves to carry out a CBS (Come Back Search) operation to move upwardly the elevator 13 to allow the compact disk 12 to come back to the position where the magazine 11 is accommodated as shown in FIG. 3, a DGS (Disk Get Search) operation to move upwardly and downwardly the elevator 13 to go for (get and search) a target or objective compact disk 12 as shown in FIG. 4, a LOAD operation to load the compact disk 12 onto the elevator 13 as shown in FIG. 5, a SAVE operation to pull or draw the compact disk 12 on the elevator 13 into the magazine 11 as shown in FIG. 6, a LVO (Lever Out) operation to completely accommodate the compact disk 12 into the magazine 11 by allowing a lever (not shown) to be operated as shown in FIG. 7, a GTH (Go To Home) operation to lower the elevator 13 on a pick-up of a player (not shown) as shown in FIG. 8, an EJECT operation to send the magazine 11 out from the unit body 10 as shown in FIG. 9, a PSET (Pack SET) operation to pull or draw the magazine 11 into the unit body 10 as shown in FIG. 10.

Figure 11:
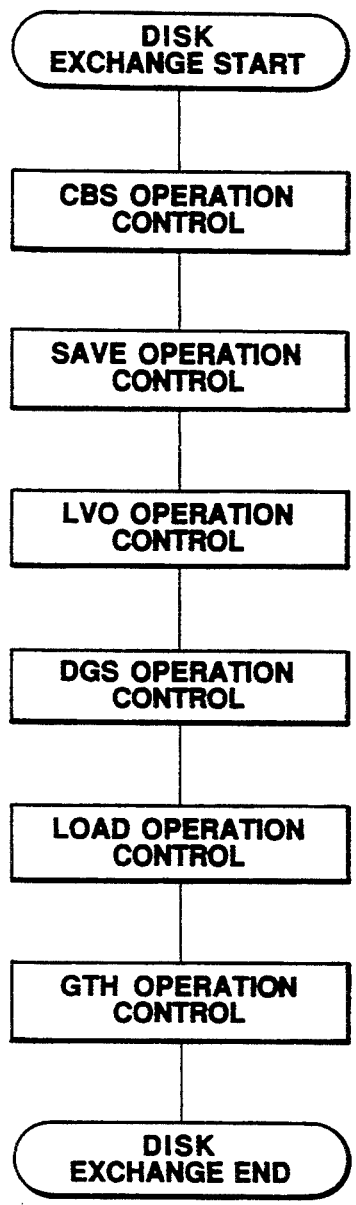
FIG. 11 is a flowchart showing a control procedure of the above-mentioned mechanical deck unit as executed by a microcomputer in the case where disk exchange is carried out by means of the disk changer.

Thus, the microcomputer 1 carries out the operation control of the mechanical deck unit 4 in order of the CBS operation control, the SAVE operation control, the LVO operation control, the DGS operation control, the LOAD operation control, and the GTH operation control in accordance with the procedure shown in the flowchart of FIG. 11, e.g., in the case where command information of disk exchange is delivered by the operation of the operation unit 2.

Figure 12:
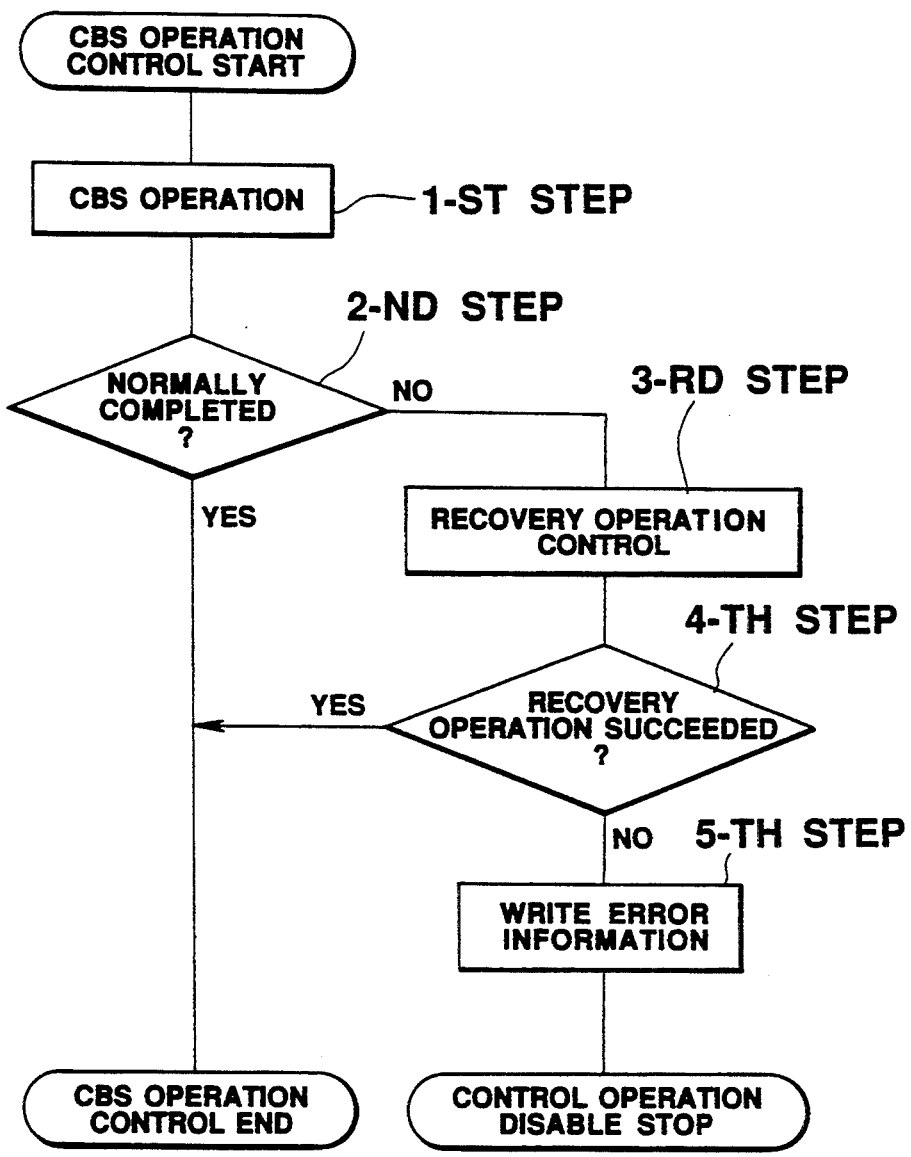
FIG. 12 is a flowchart showing the procedure of the CBS operation control of the mechanical deck unit as executed by the above-mentioned microcomputer.

More particularly, in the CBS operation control, as shown in the flowchart of FIG. 12, at first step, the CBS operation is carried out. At the subsequent second step, judgment as to whether or not the CBS operation is normally carried out is made. In the case where the judged result is "YES", i.e., the CBS operation is normally carried out, the CBS operation control is completed. The operation control shifts to the SAVE operation control. In contrast, in the case where the judged result at the second step is "NO", i.e., the CBS operation is not normally carried out, the operation control shifts to the third step to carry out the CBS recovery control operation. At the subsequent fourth step, judgment as to whether or not the CBS recovery control operation succeeded. In the case where the judged result is "YES", i.e., the CBS recovery control operation succeeded, the CBS operation control is completed. Thus, the operation control shifts to the SAVE operation control. In contrast, in the case where the judged result at the fourth step is "NO", i.e., the CBS recovery control operation has not succeeded, the control operation shifts to the fifth step to allow error information indicating that an error has occurred in the CBS operation to be indicated by "CBS" to write an error code "1" into the non-volatile memory of the memory unit 5 thereafter to stop the control as an operation disable state.

Further, also in the control operations except for the above-mentioned CBS operation control, at the time of occurrence of error, the recovery control operation is carried out. In the case where the recovery control operation does not succeed, an error code indicating that an error has occurred in that control operation is written into the non-volatile memory of the memory unit 5 thereafter to stop the control as an operation disable state.

It is to be noted that an assumption is made such that an error code in the CBS operation control is "1", an error code in the DGS operation control is "2", an error code in the LOAD operation control is "3", an error code in the SAVE operation control is "4", an error code in the LVO operation control is "5", an error code in the GTH operation control is "6", an error code in the EJECT operation control is "7", and an error code in the PSET operation control is "8".

Figure 13:
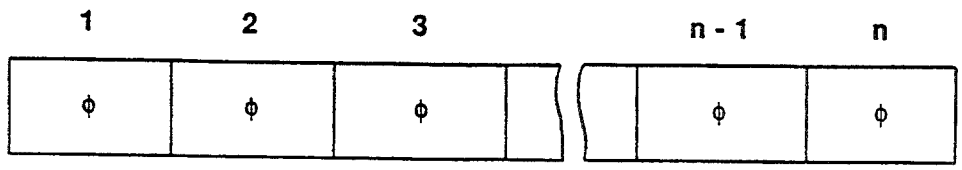
FIG. 13 is a view showing, in a model form, an initial state of the memory content of a non-volatile memory means of a memory unit of the above-mentioned disk changer.
Figure 14A:
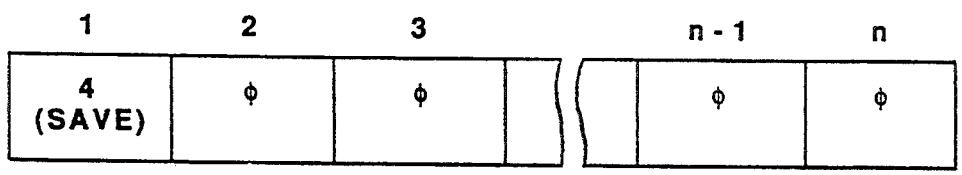
FIG. 14 is a view showing, in a model form, the memory content comprising history information of error stored by the non-volatile memory means of the memory unit.
Figure 14B:
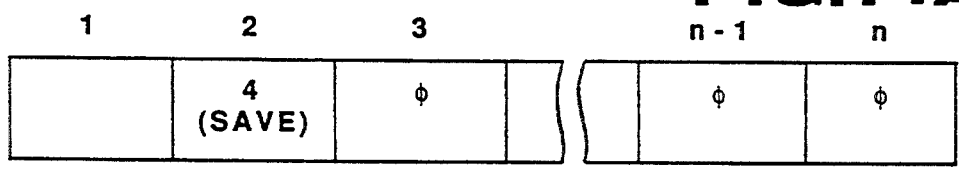
Figure 14C:
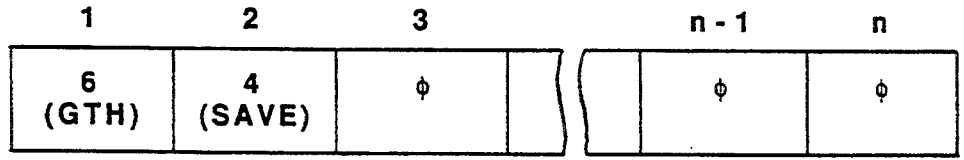
Figure 14D:
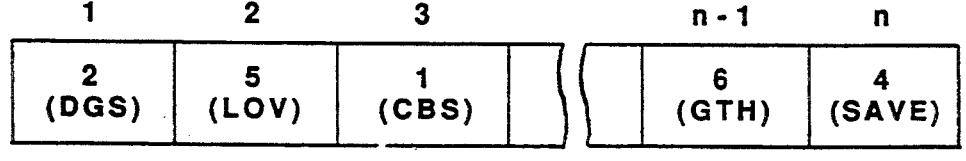
Figure 14E:
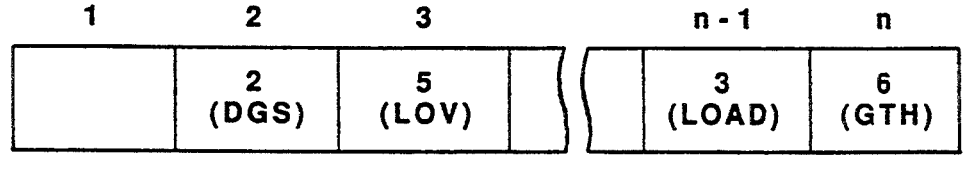
Figure 14F:
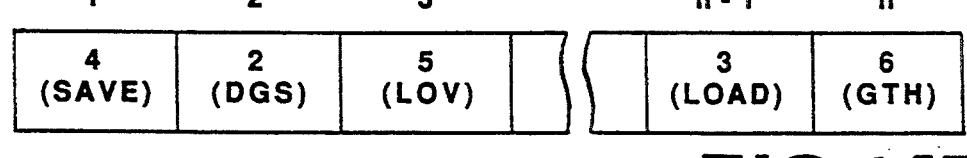

Here, in the non-volatile memory of the memory unit 5, in an initial state, a code "0"indicating that no error takes place is written as shown in FIG. 13.

Further, in the non-volatile memory of the memory unit 5, as shown at A to F of FIG. 14, for every occurrence of error, error codes previously written are sequentially written with their memory addresses being incremented. Respective latest error codes are sequentially written into a first memory address. Thus, latest n number of error codes are stored as historical information of errors that have occurred in the past. In the case where command information of a service mode is delivered to the microcomputer 1 by an operation of the operation unit 2, the microcomputer 1 carries out a control to arbitrarily designate, by means of a readout pointer, any one of the memory addresses where error codes are written in the non-volatile memory of the memory unit 5 in a manner stated above to read out that error code, and carries out a display control for displaying the error code read out from the non-volatile memory on the display unit 3.

As stated above, in the disk changer of this embodiment, every time any error takes place in the operation of the mechanical deck unit 4 where the recovery control and/or the automatic stop control, etc. are carried out in accordance with a predetermined control program by the microcomputer 1, an error code indicating the content of that error is written into the non-volatile memory of the memory unit 5, and historical information of errors occurred in the past is stored into the non-volatile memory. Further, since it is possible to read out historical information of error from the non-volatile memory and to display it on the display unit 3, a suitable measure for error can be implemented on the basis of the historical information of error.

It is to be noted that while this invention is applied to a disk changer system in the above-described embodiment, this invention is not limited to only the above-described embodiment. While, e.g., in the above-described embodiment, E$^2$PROM was used as a non-volatile memory for storing historical information, a SRAM with a battery may be used. Further, as the content of an error may be written into the non-volatile memory, not only the content of the state at the time when the operation is unsatisfactory as described above, but also the contents of all errors which can take place in respective equipment, such as, for example, a focus error or a tracking error in the disk servo control, an error in communication, or the like may be stored.

As is clear from the foregoing description, in the electronic equipment according to this invention, every time any error takes place in the operation of various controlled units where the recovery control and/or the automatic stop control, etc. are carried out in accordance with a predetermined control program by the microcomputer, an error code indicating the content of that error is written into the non-volatile memory, and historical information of errors that occurred in the past is stored into the non-volatile memory. Further, it is possible to read out such historical information from the non-volatile memory and to display it. Thus, a suitable measure for error can be implemented on the basis of the historical information.

What is claimed is:

1. An electronic system in which a microcomputer for system control is assembled, comprising:

disc changing means for changing and transferring stacked discs from one of a stacked position or a playing position to other of said stacked position or said playing position, including a plurality of units each for performing a respective plurality of operations and each being controlled by said microcomputer;

input means connected to said microcomputer for inputting a command to said microcomputer;

memory means including non-volatile memory means in communication with said microcomputer such that when an error occurs in an operation of one of said plurality of units controlled by said microcomputer, error information identifying said operation in which said error occurred is written into said non-volatile memory means in response to a control signal from said microcomputer, wherein said non-volatile memory means has n memory addresses and said error information comprises a respective different error code for each of a plurality of possible operations, and error codes are sequentially written into said memory means at each occurrence of an error with memory addresses being sequentially incremented so that a latest n error codes are stored thereinto as history information; and output means for reading out said history information from said non-volatile memory means in response to a second control signal issued by said microcomputer, including error information at any arbitrary address designated by said microcomputer in response to a service command input through said input means, wherein said output means includes display means connected to said microcomputer for displaying said history information read out from said non-volatile memory means according to said second control signal from said microcomputer.

2. An electronic system as set forth in claim 1, wherein said input means includes operation means connected to said microcomputer and adapted to deliver to said microcomputer operation command information for carrying out operation controls of respective ones of said plurality of units controlled by said microcomputer and read-out command information for reading out said history information stored in said non-volatile memory means from said non-volatile memory means.

3. An electronic system as set forth in claim 2, wherein said output means reads out said error information from said non-volatile memory means at said any arbitrary address designated by said microcomputer in response to a service command delivered by said operation means.

* * * * *